(12) United States Patent
Afanasev et al.

(10) Patent No.: US 10,566,491 B2
(45) Date of Patent: Feb. 18, 2020

(54) SOLAR CELL USING QUANTUM DOTS AND METHOD OF FABRICATING SAME

(71) Applicant: The George Washington University, Washington, DC (US)

(72) Inventors: Andrei Afanasev, Leesburg, VA (US); Ara Kechiantz, Ashburn, VA (US); Jean-Louis Lazzari, Marseilles (FR)

(73) Assignees: The George Washington University, Washington, DC (US); National Centre for Scientific Research, Paris (FR)

( * ) Notice: Subject to any disclaimer, the term of this patent is extended or adjusted under 35 U.S.C. 154(b) by 613 days.

(21) Appl. No.: 13/911,935

(22) Filed: Jun. 6, 2013

(65) Prior Publication Data

US 2014/0224328 A1 Aug. 14, 2014

Related U.S. Application Data

(60) Provisional application No. 61/763,799, filed on Feb. 12, 2013.

(51) Int. Cl.
*H01L 31/0352* (2006.01)
*H01L 31/18* (2006.01)
(Continued)

(52) U.S. Cl.
CPC .. *H01L 31/1844* (2013.01); *H01L 31/035218* (2013.01); *H01L 31/035236* (2013.01); *H01L 31/0693* (2013.01); *B82Y 30/00* (2013.01); *B82Y 99/00* (2013.01); *Y02E 10/544* (2013.01); *Y10S 977/774* (2013.01); *Y10S 977/948* (2013.01)

(58) Field of Classification Search
CPC ..... H01L 31/035272; H01L 31/035209; H01L 31/035236; H01L 31/1844; H01L 31/035218; H01L 31/03046; H01L 31/00; H01L 31/02; H01L 31/0216; H01L 31/02167; H01L 31/0248; H01L 31/03042;
(Continued)

(56) References Cited

U.S. PATENT DOCUMENTS

| | | | | |
|---|---|---|---|---|
| 2002/0050288 A1* | 5/2002 | Suzuki | ................... | B82Y 20/00 136/255 |
| 2006/0266998 A1* | 11/2006 | Vega | ..................... | B82Y 10/00 257/21 |
| 2009/0095349 A1* | 4/2009 | Forrest | .................. | B82Y 30/00 136/262 |

OTHER PUBLICATIONS

Wurfel, Peter. ("Physics of Solar Cells: From Basic Principles to Advanced Concepts, $2^{nd}$ Edition"), 2009.*
(Continued)

*Primary Examiner* — Christina Chern
(74) *Attorney, Agent, or Firm* — Blank Rome LLP

(57) ABSTRACT

An efficient solar cell and method of fabricating the same is disclosed. The solar cell includes an n-doped substrate layer. A p-doped buffer layer is disposed on the n-doped substrate layer. A quantum dot absorber stack is disposed on the buffer layer. The absorber stack includes at least one quantum dot layer and one p-doped spacer layer. A p-doped cap layer is disposed on the quantum dot absorber layer. The thickness of the quantum dot layer is less than an electron diffusion length from the depletion region formed by the n-doped substrate layer and the p-doped buffer layer. The quantum dot absorber layer allows for additional photo currents from two-photon absorption from the p-doped cap layer being exposed to a light source.

16 Claims, 5 Drawing Sheets

(51) Int. Cl.
  *H01L 31/0693* (2012.01)
  *B82Y 99/00* (2011.01)
  *B82Y 30/00* (2011.01)

(58) Field of Classification Search
  CPC . H01L 31/0304; H01L 31/0352; H01L 31/04; H01L 31/072; H01L 31/0735
  See application file for complete search history.

(56) References Cited

OTHER PUBLICATIONS

Strandberg et al. ("Drift-diffusion model for intermediate band solar cells including photofilling effects"); Prog. Photovolt: Res. Appl. 2011; 19: 21-32.*

Luque et al. ("Understanding intermediate-band solar cells"); Nature Photonics 6, 146-152 (2012).*

A. Kechiantz, A. Afanasev, and J.-L. Lazzari, Photovoltaic Technical Conference: Thin Film & Advanced Silicon Solutions Aix En Provence, France, May 22-24, 2012 Efficiency Limit of Intermediate Band AlxGa1-xAs Solar Cell Based on AlyGa1-ySb Type-II Quantum Dots Embedded Outside of the Depletion Region.

A. Kechiantz, A. Afanasev, and J.-L. Lazzari, 27th European Photovoltaic Solar Energy Conference and Exhibition, Frankfurt, Germany—Sep. 24-28, 2012: Efficiency Limit of AlxGa1-xAs Solar Cell Modified by AlyGa1-ySb Quantum Dot Intermediate Band Embedded Outside of the Depletion Region.

Aroutiounian V., Petrosyan S., Khachatryan A., and Touryan K., "Quantum dot solar cells", J. Appl. Phys. 89, 2268-2271 (2001).

Kechiantz A. M., Afanasev A., Lazzari J.-L., "Modification of band alignment at interface of AlyGa1-ySb/AlxGa1-xAs type-II quantum dots by concentrated sunlight in intermediate band solar cells with separated absorption and depletion regions", SPIE Paper # 8620-20, SPIE Photonics West 2013—OPTO, Optoelectronic Materials and Devices, Conference OE102: Physics, Simulation, and Photonic Engineering of Photovoltaic Devices II, The Moscone Center, San Francisco, California (USA), Feb. 2-7, 2013.

Kechiantz A. M., Afanasev A., Lazzari J.-L., A. Bhouri, Y. Cuminal, and P. Christol, "Efficiency limit of $Al_xGa_{1-x}As$ solar cell modified by $Al_yGa_{1-y}Sb$ quantum dot intermediate band embedded outside of the depletion region", Proc. 27th EU PVSEC 16877, 412-417 (2012).

Kechiantz A.M., Kechiyants H.M., Kocharyan L.M, "Contribution of Type II Quantum Dots Into Dark Current in Intermediate Band Solar Cells", in Proc. of the Sixth International Conference on Semiconductor Mikro- & Nano-Electronics, Sep. 18-20, 2007, Yerevan, Armenia.

Kechiantz A.M; Tuning up the performance of GaAs-based solar cells by inelastic scattering on quantum dots and doping of AlyGai_ySb type-II dots and AlxGai_xAs spacers between dots (dated prior to 2013).

Kechiantz A.M., Modeling the Fundamental Limit on Conversion Efficiency of QD Solar Cells, Oral presentation at French-Belarusian Seminar on Frontiers of Nanoscale Spintronics and Photovoltaics, Nov. 17-19, 2009 Marseille France http://www.cinam.univ-mrs.fr/confs/FrontNanoSpinPhoto/PDF/KECHIANTZ.pdf.

Luque A., and Marti A., "The Intermediate Band Solar Cell: Progress Toward the Realization of an Attractive Concept", Adv. Matter 22, 160-174 (2010).

Luque A., Linares P. G., Antolm E., Ramiro I., Farmer C. D., Hernandez E., Tobias I., Stanley C. R., and Marti A., Understanding the operation of quantum dot intermediate band solar cells, J. Appl. Phys. 111, 044502 (2012).

Luque A., Marty A., and Stanly C., "Understanding intermediate-band solar cells", Nature Photonics 6, 146-152, (2012).

Sato D., Ota J., Nishikawa K., Takeda Y., Miyashita N., and Okada Y., "Extremely long carrier lifetime at intermediate states in wall-inserted type II quantum dot absorbers", J. Appl. Phys. 112, 094305 (2012).

Shockley W. and Queisser H. J., "Detailed Balance Limit of Efficiency of p-n Junction Solar Cells", J. Appl. Phys. 32, 510-519 (1961).

A. Luque et al., "Increasing the Efficiency of Ideal Solar Cells by Photon Induced Transitions at Intermediate Levels." Physical Review Letters, vol. 78, No. 26, pp. 5014-5017, Jun. 30, 1997.

A. Marti et al., "Quasi-Drift Diffusion Model for the Quantum Dot Intermediate Band Solar Cell." IEEE Transactions on Electron Devices, vol. 49, No. 9, pp. 1632-1639, Sep. 2002.

T. Sogabe et al., "Recent Progress on Quantum Dot Solar Cells: a Review." Journal of Photonics for Energy, vol. 6, No. 4, pp. 040901-1-040901-27, Oct.-Dec. 2016.

* cited by examiner

SOLAR CELL USING QUANTUM DOTS AND METHOD OF FABRICATING SAME

PRIORITY

The present application claims priority to U.S. Provisional Application 61/763,799 filed on Feb. 12, 2013, which is hereby incorporated by reference in its entirety.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

TECHNICAL FIELD

The present invention relates generally to solar power cells, and more particularly, to using layers of quantum dots spatially separated from the depletion region to increase efficiency of solar power cells.

BACKGROUND

The drive for alternative energy has increased development of photovoltaic ("PV") solar cells, which may have numerous applications such as for powering stand-alone small scale devices up to power plants that may be connected to the electrical grid. The challenge for solar cells is to efficiently convert light into electrical energy. Traditional photovoltaic cells are commonly composed by doped semiconductor material such as silicon or gallium arsenide (GaAs) with depositing metallic contacts. Doped semiconductor material such as silicon forms a thin layer on the top of the cell, producing a p-n junction having a specific, band gap energy. Photons from a light source hit the top of the solar cell and are transmitted to the doped semiconductor material. Transmitted photons have the potential to impart their energy to an electron, generating an electron-hole pair. In a depletion region created around the interface of the n-doped and p-doped regions, a drift electric field accelerates both electrons and holes towards respective n-doped and p-doped regions in the cell. The resulting current is termed the photocurrent. Consequently, due to the accumulation of charges, a potential voltage and a photocurrent appears to generate electricity from the solar energy spectrum. Certain semiconductor materials such as GaAs provide optimal band gaps for solar energy conversion and are therefore more efficient in conversion than silicon.

Traditional solar cells based on the p-n junction are limited to certain wavelengths of transmitted light. Thus, only photons within those wavelengths are efficiently converted to electrical energy. There is no semiconductor that can be deployed for making a solar cell that converts the entire solar spectrum to electrical energy. The Shockley-Queisser limit for conversion efficiency of solar cells is calculated in the framework of the principle of detailed balance assuming ideal conditions of only radiative interband electron transitions in the solar cell. The model assumes that photoelectrons generated by the above-band gap photons quickly relax to the conduction band edge by transferring their excess energy to the semiconductor lattice due to the intra-band scattering on optical phonons. This relaxation absorbs about 30% of solar energy. The sub-band gap photons compose another 30% of solar energy that the Shockley-Queisser model of an ideal p-n junction misses.

One solution that has been suggested is multi junction solar cells containing several p-n junctions. Each junction is tuned to a different wavelength of light, reducing one of the largest inherent sources of losses, and thereby increasing efficiency. Traditional single junction cells have a maximum theoretical efficiency of 34%, a theoretical "infinite-junction" cell would improve this to 87% under highly concentrated sunlight. However this efficiency is gained at the cost of increased complexity and manufacturing price.

Another solution is an intermediate band (IB) concept that makes use of the energy of sub-band gap photons based on the non-linear effect of two-photon absorption. If the total energy of two sub-band-gap photons exceeds the energy of band-gap, consecutive absorption of two photons may transfer a valence band electron into the conduction band resulting in an additional photocurrent. The IB concept exploits a band of intermediate electronic states located in the semiconductor band gap for resonant absorption. If IB states did not result in electron-hole recombination (like impurity defect states), IB solar cells would convert up to 63% of concentrated sunlight into electricity.

Quantum dot solar cells have also been investigated to form IB solar cells. Quantum dots are particles of semiconductor material that have been reduced below the size of the Exciton Bohr-radius, and have band gaps that are tunable across a wide range of energy levels by changing the quantum dot size. The ability to tune the band gap allows for solar cells that can convert photons in regions, such as infrared, that were previously not captured. Type-I quantum dots facilitate two-photon absorption of sub-band gap photons, however, they also lead to generation of additional dark current reducing both open circuit voltage and conversion efficiency of the cells. Since the depletion region is the most sensitive part of solar cells where electronic states easily facilitate recombination, the location of type-I quantum dots inside the depletion region boosts the dark current of quantum dot IB solar cells. Thus, quantum dots suffer from recombination of holes and electrons, which serves as a major limiting factor for conversion efficiency of quantum dot solar cells Thus, there is a need for a solar cell that can increase efficiency by capturing photons at a wide range of wavelengths using quantum dots. There is a further need for the incorporation of the traits of Type II quantum dots in a solar cell. There is a further need for the spatial separation of a quantum dot absorber layer from the depletion region for taking advantage of suppression of addition dark current associated with electron-hole recombination through quantum dots located in the depletion region.

SUMMARY

According to one example, a solar cell includes an n-doped substrate layer and a p-doped buffer layer disposed on the n-doped substrate layer. A quantum dot absorber stack is disposed on the buffer layer. The quantum dot absorber stack includes at least one quantum dot layer having quantum dots and one spacer layer. A p-doped cap layer is disposed on the quantum dot absorber stack. The p-doped cap layer is exposed to a light source. The thickness of the quantum dot absorber stack is within an electron diffusion length from the depletion region formed by the n-doped substrate layer and the p-doped buffer layer.

Another example is a method of fabricating a solar cell. A GaAs substrate is n-doped to form an n-doped substrate.

A p-doped buffer layer is formed on the n-doped substrate. A plurality of spacer layers and quantum dot layers including quantum dots are epitaxially formed on the buffer layer to form a quantum dot absorber stack having a thickness less than an electron diffusion length. The p-doped buffer layer has a thickness sufficient to prevent electron tunneling from a depletion region formed from the n-doped substrate and the p-doped buffer layer into electronic states confined in the quantum dots of the quantum dot layers. A p-doped cap layer is formed over the quantum dot absorber stack.

Another example is a quantum dot based GaAs solar cell having an n-doped substrate layer forming one end of a p-n junction. A p-doped buffer layer is disposed on the n-doped substrate layer and forms another end of the p-n junction. A depletion region is formed from the n-doped substrate layer and the p-doped buffer layer. A quantum dot absorber stack is disposed on the buffer layer. The quantum dot absorber stack includes a plurality of quantum dot layers having Type II quantum dots and a corresponding plurality of spacer layers. A p-doped cap layer having a p-region is formed on the quantum dot absorber stack. The p-doped cap layer is exposed to a light source. The thickness of the quantum dot absorber stack is within an electron diffusion length from the depletion region.

Additional aspects of the invention will be apparent to those of ordinary skill in the art in view of the detailed description of various embodiments, which is made with reference to the drawings, a brief description of which is provided below.

Figure 1:
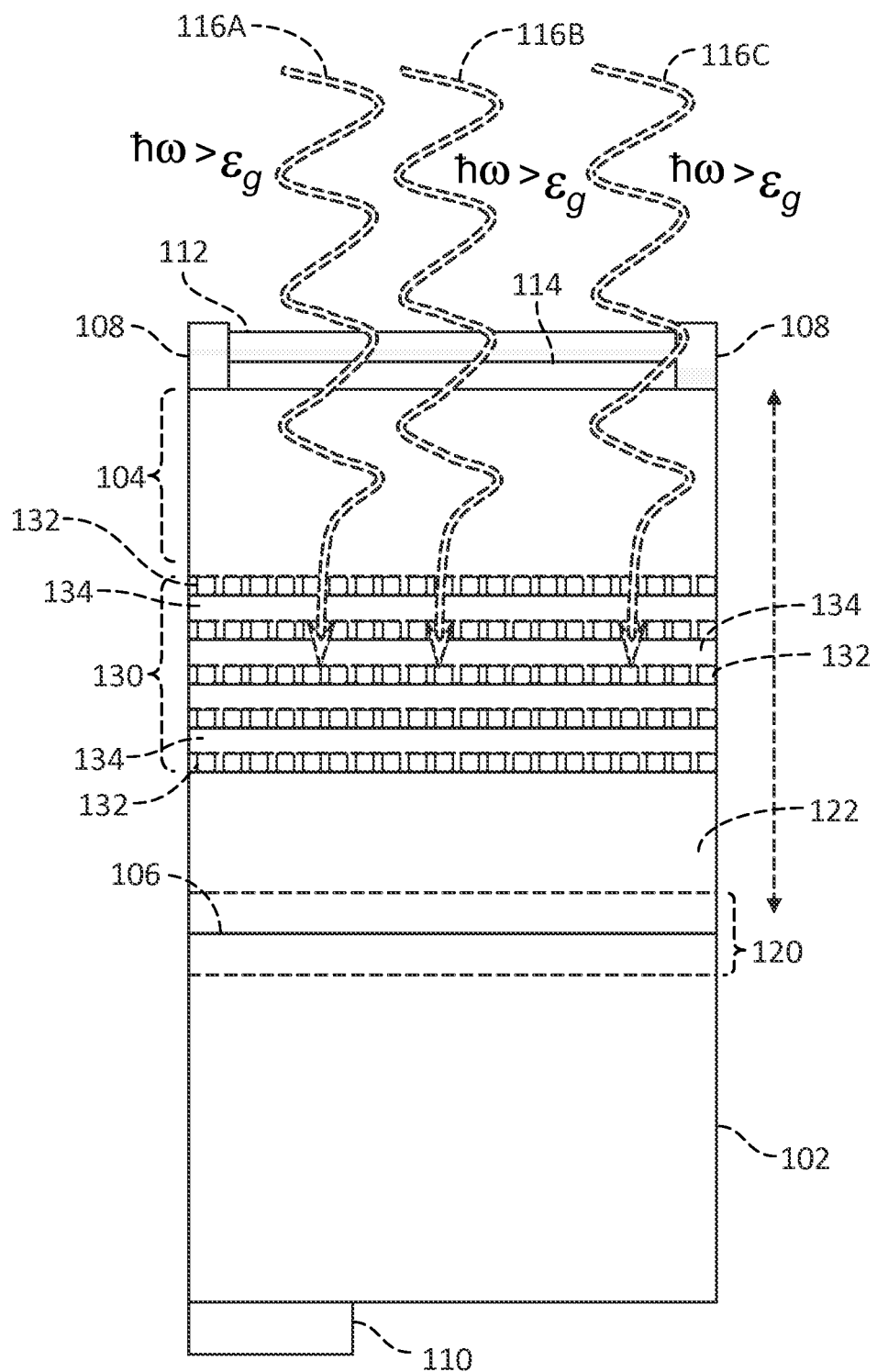
FIG. 1 is a cross-section view of a solar cell with a quantum dot absorber stack resulting in increased solar energy conversion efficiency.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 shows a solar cell 100 that increases efficiency of solar energy conversion via quantum dots. The solar cell 100 includes an n-doped substrate 102 and a p-doped cap layer 104. The n-doped substrate 102 forms part of a p-n junction 106. An electrode pattern 108 is in contact with the p-doped cap layer and an electrode 110 is in contact with the bottom of the n-doped substrate layer 102. As is understood, an anti-reflective coating 112 is applied between the electrode pattern 108. A $p^+$-doped wide band gap, transparent conducting, optical window layer 114 is formed on the p-doped cap layer 104 for conveying photoelectrons to the electrode pattern 108. A light source emits photons 116A-116 which are absorbed by the body of the cell 100 as will be explained below. The photons 116A-116C are from different solar spectral ranges. For example, the photon 116A is from the spectral range above the band tap energy of the semiconductor material of the solar cell 100. Therefore it directly excites mobile electrons into the conduction band of the solar cell 100 to generate photocurrent. The photons 116B and 116C are from the spectral ranges below the band gap energy of the semiconductor material of the solar cell 100 but may still excite mobile electrons into the conduction band to contribute to the photocurrent generation due to quantum dots in the solar cell 100 as will be explained below.

The opposite surface of the n-doped substrate 102 from the bottom electrode 110 forms a depletion region 120 with a p-doped buffer layer 122 that includes the p-n junction 106. The buffer layer 122 of p-doped material is formed on the substrate 102. The buffer layer 122 separates a quantum dot absorber stack 130 from the depletion region 120. The opposite surface of the quantum dot absorber stack 130 from the surface bordering the buffer layer 122 is in contact with the p-doped cap layer 104. As shown in FIG. 1, the quantum dot absorber stack 130 includes alternating strained quantum dot layers 132 and spacer layers 134. As will be explained below, the quantum dot layers 132 and spacer layers 134 are grown epitaxially on the buffer layer 122. Sufficient numbers of quantum dot layers 132 and spacer layers 134 are stacked to absorb all of the photon energy transmitted from a light source represented by the photons 116A-C. In this example, 10-15 sets of layers 132 and 134 are used for the quantum dot absorber stack 130 but more or less sets of layers may be used, depending on the absorption coefficient of quantum dots and of their density within the quantum dot layers.

All of the respective layers 132 and 134 of the quantum dot absorber stack 130 are within the electron diffusion length distance from the depletion region 120. The spacer layers 134 act as non-tunneling barriers surrounding the quantum dots in the valence band of the quantum dot layers 132. The p-doped buffer layer 122 and the n-doped substrate 102 form the ideal p-n junction 106. The p-doped buffer layer 122 is sufficiently thick (in this example 200 nm) to separate the edge of the depletion region 120 from the quantum dot absorber stack 130. The buffer layer 122 prevents electron tunneling from the n-doped substrate 102 through the p-n junction 106 into the electronic states confined in the quantum dots of the absorber stack 130.

In this example, the buffer layer 122 is a thin $p^+$-doped (Aluminum-Gallium-Arsenide) $Al_xGa_{1-x}As$ layer grown on the $n^+$-doped (gallium-arsenide) GaAs substrate 102. The p-doped cap layer 104 is a $p^+$-doped $Al_xGa_{1-x}As$ material in this example. The quantum dot layers 132 of the quantum dot absorber stack 130 include (gallium-antimony) GaSb strained quantum dots. The spacer layers 134 are preferably un-doped graded $Al_xGa_{1-x}As$ material identical to that of the p-doped cap layer 104 or the buffer layer 122. The layers 132 and 134 in the quantum dot absorber stack 130 are doped at a lower level than the buffer layer 122 or the cap layer 104. Alternatively, $Al_xGa_{1-x}Sb/Al_xGa_{1-x}As$ type II quantum dots or p+ $Al_xGa_{1-x}As$/p− GaAs/GaSb quantum dots may be used for the quantum dot layers 132.

The quantum dots in the quantum dot layers 132 in FIG. 1 are preferably Type-II quantum dots. Type II quantum dots are a family of zero-dimensional semiconductor building-blocks that exhibit unique electronic properties. Type-II quantum dots, whose confined electronic states are in the valence band, spatially separate mobile electrons of the conduction band from holes confined in the quantum dots. Such separation decreases the recombination rate of these carriers. In GaSb/GaAs strained semiconductor systems, the lifetime of mobile electrons with respect to recombination with holes confined in GaSb type-II quantum dots is about 10 ns, which is very close to the electron-hole radiative recombination lifetime in GaAs. Since the quantum dots in the quantum dot absorber stack 130 are separated from the depletion region 120, there is no effect on the electron-hole overall recombination rate and hence dark current. This gives more flexibility for designing the solar cell structures.

Figure 2A:
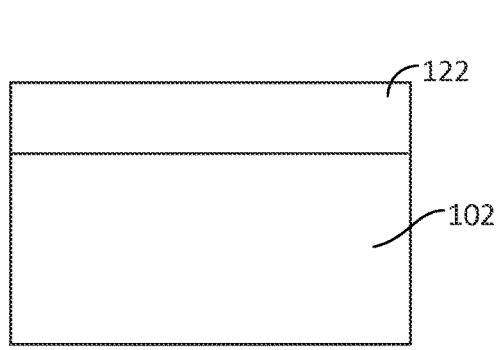
FIG. 2A-2D are cross-section views of the process of fabricating the solar cell in FIG. 1.
Figure 2B:
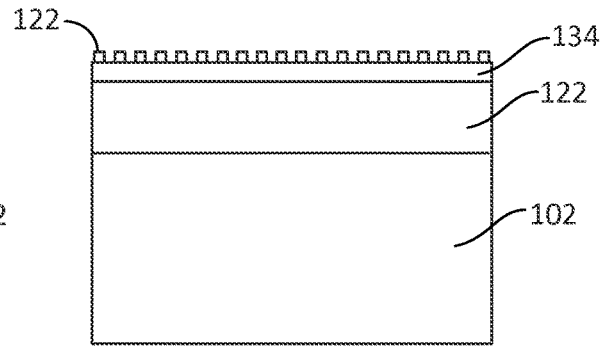
Figure 2C:
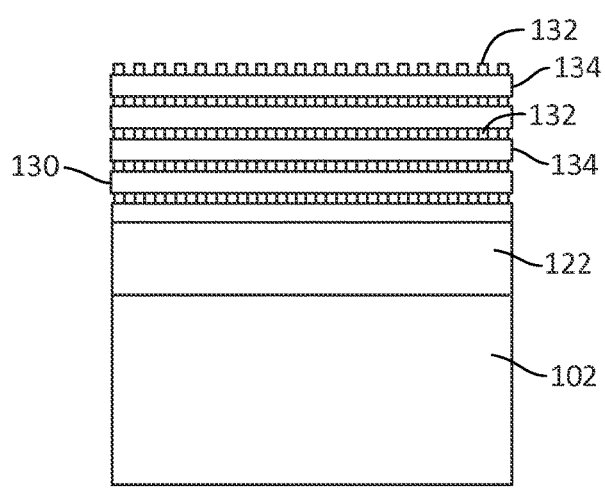
Figure 2D:
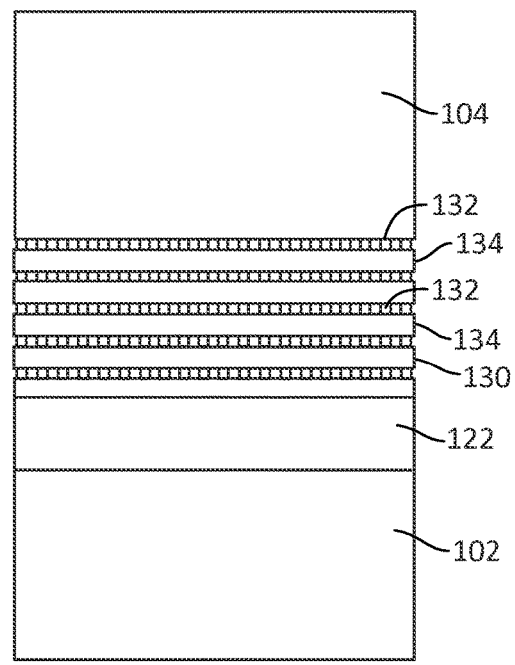

FIG. 2A-2D show the process of fabricating the solar cell 100 in FIG. 1. FIG. 2A shows the solar cell 100 after the p-doped $Al_xGa_{1-x}As$ buffer layer 122 is formed on the n-doped GaAs substrate 102. In this example, the p-doped epitaxial buffer layer 122 has a thickness of 200 nm which is sufficient to prevent electron tunneling from the depletion region formed from the n-doped substrate 102 and the p-doped buffer layer 122 into electronic states confined in the quantum dots of the quantum dot layers 132 in FIG. 1. FIG. 2B shows the epitaxial formation of a first spacer layer 134 and a first quantum dot layer 132 on the buffer layer 122. FIG. 2C shows the additional epitaxial formation of other spacer layers 134 and quantum dot layers 132 to form the quantum dot absorber stack 130 having a thickness less than an electron diffusion length. Finally, FIG. 2D shows the growth of the p-doped cap layer 104 over the quantum dot absorber stack 130. The electrodes 108 and 110, and the wide band gap transparent conducting optical window layer 114 are then added to complete the solar cell 100.

Figure 3:
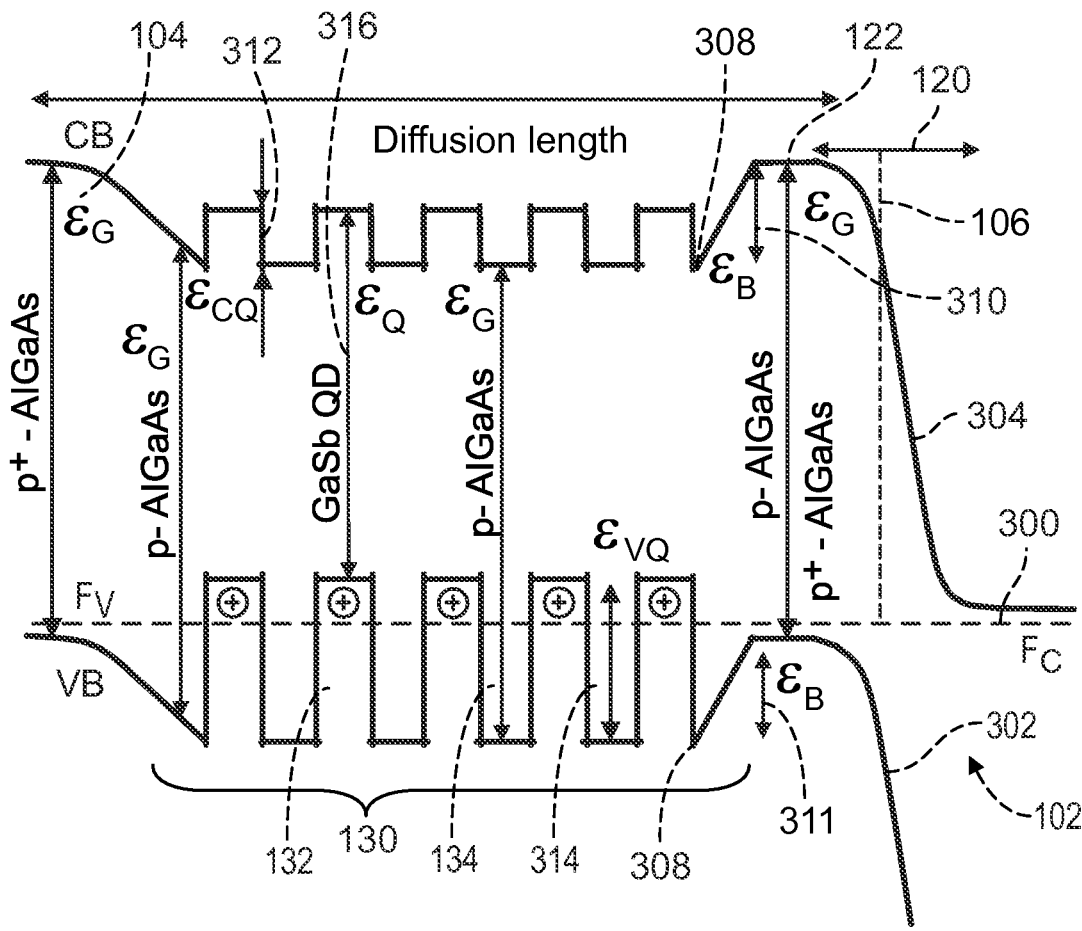
FIG. 3 is an energy band diagram of the solar cell in FIG. 1 in the dark when screened from a light source.

FIG. 3 is an energy diagram of the solar cell 100 shown in FIG. 1 in the dark when the solar cell 100 is screened from a light source. Like element numbers in FIG. 1 represent like elements in FIG. 3. FIG. 3 shows the Fermi level represented by a dashed line 300 across the cell 100. In this example, the layers 132 and 134 of the quantum dot absorber stack 130 are lower doped which is accomplished by the higher doping of the $p^+$-doped $Al_xGa_{1-x}As$ cap layer 104 and the $p^+$-doped $Al_xGa_{1-x}As$ buffer layer 122. This modulation doping equalizes the Fermi level 300 across the cell as shown in FIG. 3. A line 302 represents the shape of valence band edge in the cell 100 and a line 304 represents the shape of the conduction band edge in the cell.

As shown in FIG. 3, the energy band barrier represented by lines 310 and 311 rises in the buffer layer 122 that separates the quantum dot absorber stack 130 from the depletion region 120. This structure avoids generation of addition dark current associated with recombination through the quantum dots since the quantum dot absorber stack 130 is spatially separated from the depletion region 120. The modulation doping of the quantum dot absorber stack 130 lowers the conduction band edge of the stack 130 represented by a point 308 relative to that in the $p^+$-doped $Al_xGa_{1-x}As$ cap layer 104 and the $p^+$-doped $Al_xGa_{1-x}As$ buffer layer 122 by a blocking barrier $\varepsilon_B$ represented by the line 310 in FIG. 3. This reduction in the band edge does not reach the depletion region 120 of the p-n junction 106 so that photoelectrons generated in the conduction band of the stack 130 face the blocking barrier $\varepsilon_B$ 310 in the conduction band on their way to the p-n junction 106. Due to the misalignment of energy bands in Type-II quantum dots, the conduction band electrons also face an $\varepsilon_{CQ}$ offset-barrier as shown by the line 312 that spatially separates them from holes confined in the quantum dots. The spatial separation slows down the lifetime associated with non-radiative inter-band recombination of mobile electrons with the confined holes. In this example, the lifetime is slowed to 10 ns in the GaSb/GaAs strained Type-II quantum dot based absorber stack 130. While the $\varepsilon_{CQ}$ offset-barriers shown by the line 312 protect electrons from recombination with confined holes, they do not limit electron diffusion in the conduction band of $Al_xGa_{1-x}As$ spacer layers 134 as shown in FIG. 4.

Figure 4:
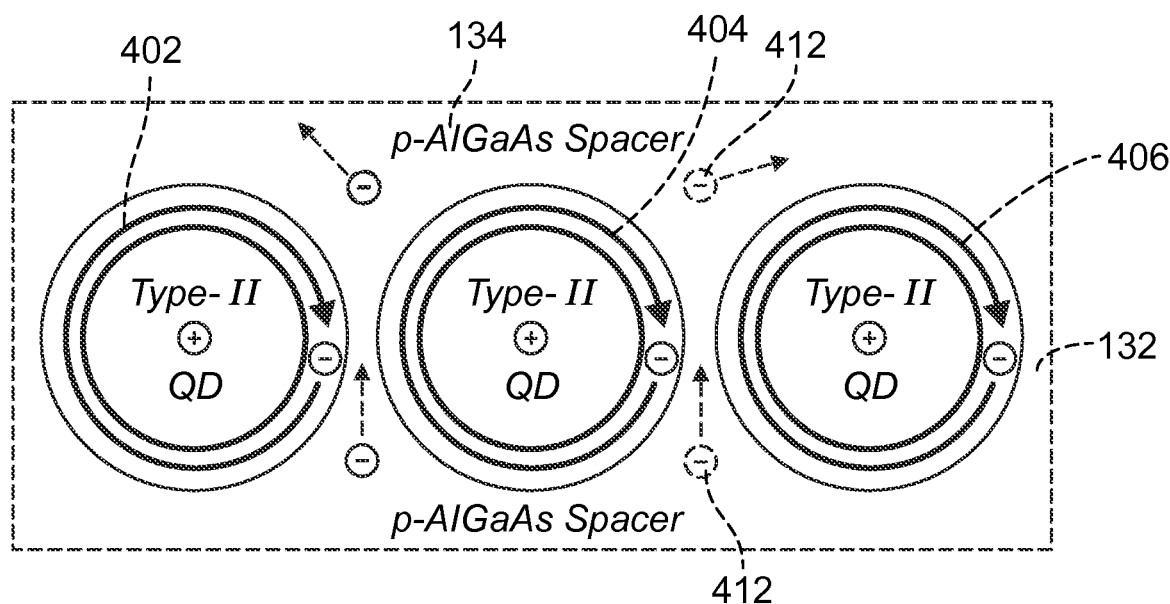
FIG. 4 is a diagram of type-II quantum dots in relation to electron diffusion in the conduction band of the quantum dot absorber stack in the solar cell in FIG. 1.

FIG. 4 is a diagram showing quantum dots 402, 404, and 406 in a quantum dot layer 132 in FIG. 1. The quantum dots 402, 404, and 406 are sandwiched between p-doped $Al_xGa_{1-x}As$ spacer layers such as the layer 134 so that electrons 412 can pass between the quantum dots 402, 404, and 406. Thus, the electrons 412 are diffused in the conduction band in the spacer layer 134 as shown in FIG. 4.

In this example, the volume of the quantum dots 402, 404, and 406 is about $10^{-18}$ cm$^3$. The small volume of the quantum dots impacts the intra-band relaxation time. Absorption of single sub-band gap photon of relevant energy in the quantum dot injects a photoelectron from the valence band into the confined electronic state of the quantum dot. Such absorption pushes the local density of photoelectrons confined in the valence band of the quantum dots up to $10^{18}$ cm$^{-3}$. Another sub-band gap photon may transfer this confined photoelectron into the conduction band, or the photoelectron may relax back into the mobile electronic state in the valence band by recombining (annihilation) with a mobile hole. Whichever is preferred depends on intensity (concentration) of sub-band gap photons and availability of mobile holes for annihilation. The $Al_xGa_{1-x}As$ spacer layers 134 create an $\varepsilon_{VQ}$ high offset-barrier represented by a line 314 around the GaSb quantum dot layers 132 as shown in FIG. 3. The $\varepsilon_B$ barrier in the valence band represented by the line 311 spatially separates mobile holes from the confined states and reduces by a factor of $\exp(\varepsilon_B/kT) \exp(\varepsilon_{VQ}/kT)$ the probability that a mobile hole can be found at the top of the valence band offset-barrier 314 and hence its probability to enter into the quantum dots. Therefore, the density of mobile holes available for annihilation is essentially lower than the $10^{18}$ cm$^{-3}$ density of the confined photoelectrons. Therefore, the density of mobile holes at the top of the offset-barrier 314 limits the non-radiative intra-band annihilation in the quantum dots by increasing the lifetime of photogenerated electrons confined in the quantum dots by $\exp(\varepsilon_B/kT)$ time.

It is well known that an absorption coefficient associated, for instance, with electron transition from the valence band into the conduction band is proportional to the density of electronic states occupied with electrons in the valence band and unoccupied states in the conduction band. In the case of narrow energy band or single energy level within a semiconductor band gap, absorption associated with electron transition from the valence band into the narrow band is proportional to the density of unoccupied confined electronic states in the narrow band while absorption associated with electron transition from the narrow band into the conduction band is proportional to the density of occupied confined electronic states in the narrow band. Since these two conditions seem incompatible, half occupation that results in matching of the quasi-Fermi level to the narrow band is the optimum for facilitating of the two-photon absorption of sub-band gap photons. In the case of quantum dots, this condition is softened. A quantum dot may have a set of discrete states within a wide energy range. For instance, a strained GaSb type-II quantum dot comprises 15 confined electronic states in the valence band. Their energy is spread over a 300 meV of the $\varepsilon_{VQ}$ energy range represented by the line 314 in the GaSb quantum dot valence band as shown in FIG. 3. Whichever state the quasi-Fermi level crosses, the GaSb quantum dot is in condition to facilitate the two-photon absorption of sub-band gap photons since a half of this state is occupied.

Figure 5:
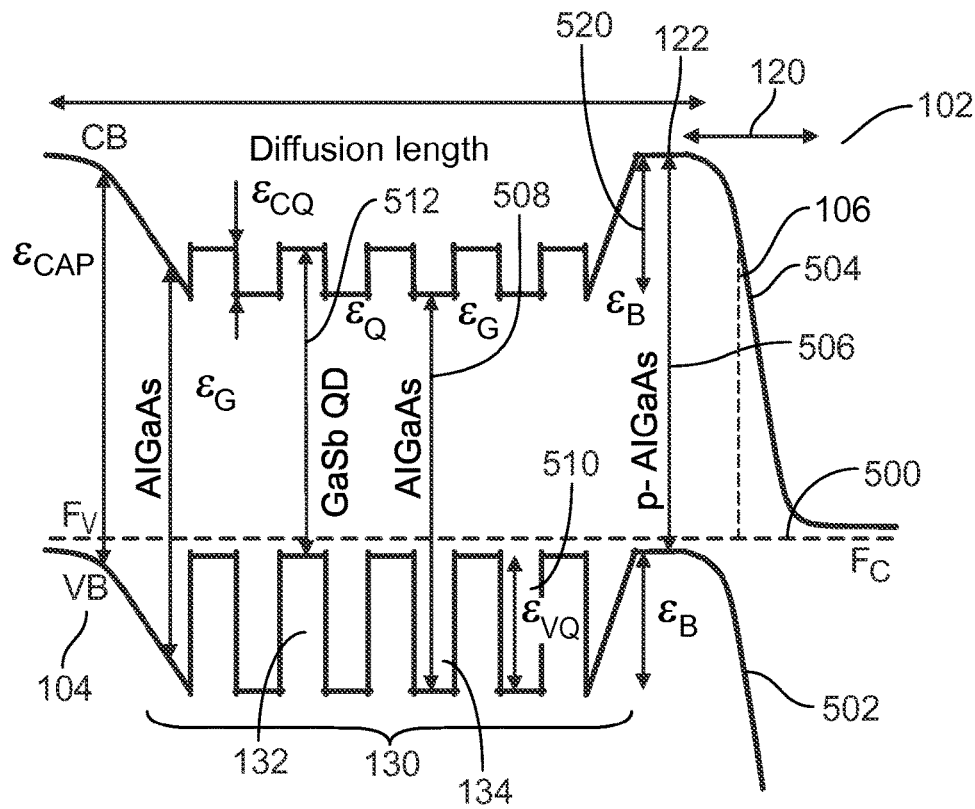
FIG. 5 is an energy band diagram of the solar cell in FIG. 1 when the valence band edge of the quantum dot absorber stack is below the Fermi level.

FIG. 5 is an energy diagram of the solar cell shown in FIG. 1 with the quantum dots in the separated GaSb/GaAs type-II quantum dot absorber stack 130 tuned such that the confined states are below the Fermi level shown as the line 500. Like element numbers in FIG. 1 represent like elements in FIG. 5. A line 502 in FIG. 5 represents the valence band edge and a line 504 in FIG. 5 represents the conduction band edge. The $Al_xGa_{1-x}As$ barrier layers 134 in valence band are non-tunneling for holes confined in the quantum dots in the quantum dot layers 132.

In this example, the quantum dot absorber stack 130 is doped non-homogeneously such that the confined states are kept below the Fermi level 500. In this example, the quantum dot absorber stack 130 is about 1 μm thick such that it absorbs all incoming photons from the $\varepsilon_Q < \hbar\omega$ spectral range. The $p^+$-doped $Al_xGa_{1-x}As$ cap layer 104 in this example is thin enough to be transparent for the above-band gap energy photons. In this example, the aluminum content, x, of the $Al_xGa_{1-x}As$ material in both the buffer layer 122 of the p-n junction 106 and cap layer 104 is higher than it is in $Al_xGa_{1-x}As$ spacer layers 134 of the quantum dot absorber stack so that the band gap ($\varepsilon_{BF}$) shown as a line 506 in the p-n junction 106 is greater than the band gap ($\varepsilon_G$) at the spacer layer 134 shown as the line 508 as shown in FIG. 5 ($\varepsilon_G < \varepsilon_{BF} \leq \varepsilon_{CAP}$). The $p^+$-doped $\varepsilon_{CAP}$-wide band gap optical window 114 caps the structure as shown in FIG. 1.

Due to the specific doping profile of the quantum dot absorber stack 130 in this example, there are only a few holes either mobile or confined in the quantum dot absorber stack 130. Therefore, the quantum dot absorber stack 130 is about transparent for $\hbar\omega_2$ gap photons from the $\varepsilon_{VQ} < \hbar\omega_2 < \varepsilon_Q$ spectral range ($\varepsilon_{VQ}$ represented by a line 510 and $\varepsilon_Q$ represented by a line 512) in FIG. 5. At the same time the one-photon inter-band absorption of both the $\hbar\omega_2$ sub-band gap and the $\hbar\omega$ above-band gap photons from $\varepsilon_Q < \hbar\omega_2 < \varepsilon_Q < \hbar\omega$ spectral ranges is very strong in such a quantum dot absorber. Also the blocking barrier $\varepsilon_B$ represented by a line 520 in FIG. 5 is higher than that of the quantum dot absorber stack 130 shown in FIG. 3. There is strong absorption of $\varepsilon_Q < \hbar\omega_1 < \varepsilon_G < \hbar\omega$ photons in quantum dot absorber stack 130 because the Fermi level 500 is above the confined states of the quantum dots. Generated photoelectrons accumulate in the conduction band of the absorber stack 130. Accumulated negative charge of those photoelectrons raise the energy bands of the quantum dot absorber stack 130, which reduces the $\varepsilon_B$ blocking barrier 520 in FIG. 5 to the level shown by the gaps 612 and 614 in FIG. 6. The reduced blocking barrier 520 facilitates photoelectron escape from the absorber stack 130 into the depletion region 120 and the n-doped region of the p-n junction 106.

Figure 6:
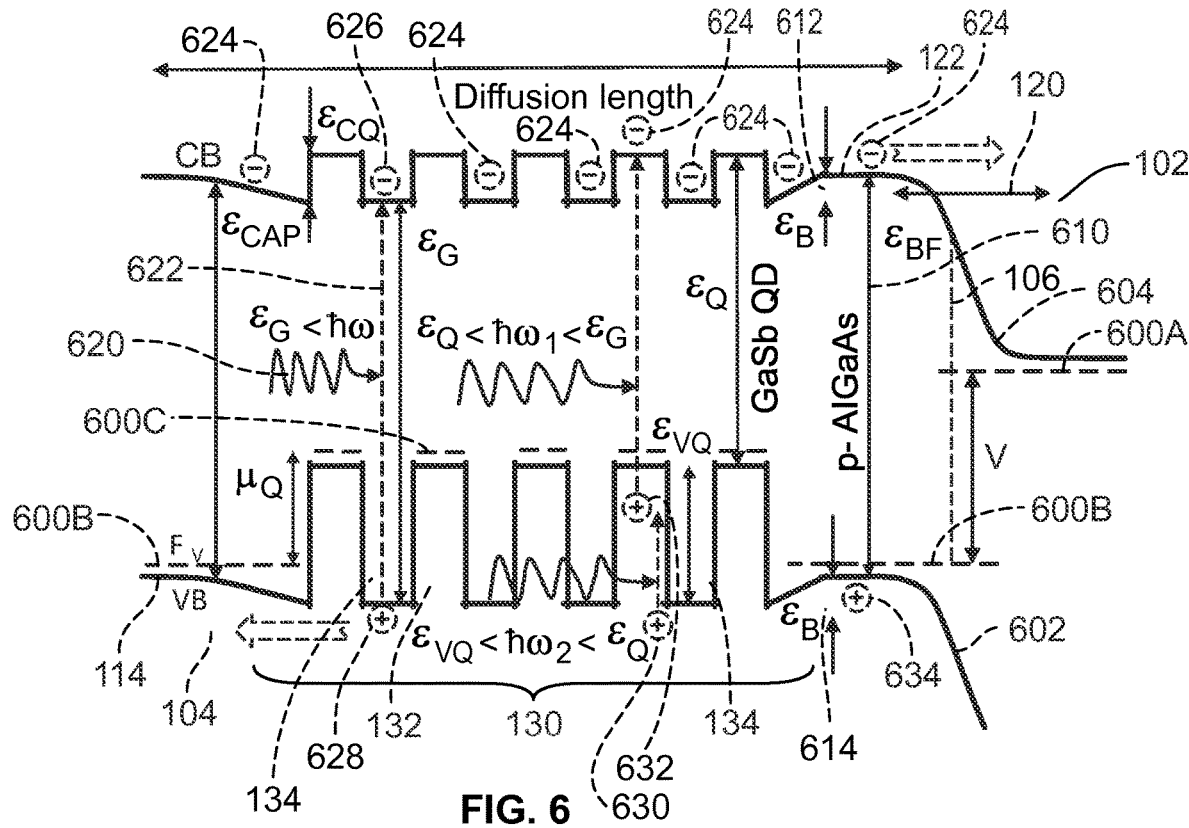
FIG. 6 is an energy band diagram of the intermediate band solar cell in FIG. 1 under extreme sunlight.

FIG. 6 is an energy band diagram of the solar cell 100 shown in FIG. 1 when exposed to concentrated sunlight. Like element numbers in FIG. 1 represent like elements in FIG. 6. The energy bands are shown via a valence band edge line 602 and a conduction band edge line 604. As may be shown in FIG. 6, the negative charge of photoelectrons 624 accumulated in the quantum dot absorber stack 130 and the positive charge accumulated in the buffer layer 122 move up the conduction and valence band edges represented by lines 604 and 602 in the quantum dot absorber stack 130, which reduces the blocking barrier ($\varepsilon_B$) shown as gaps 612 and 614 in the conduction and valence bands, respectively, as compared to that shown in FIG. 3.

Concentrated sunlight rearranges distribution of charge carriers in the solar cell 100 and split the Fermi level into quasi-Fermi levels represented by lines 600A, 600B and 600C for mobile electrons 624 and 626 in the conduction band of the quantum dot absorber stack 130, mobile holes 628 and 630 at the top of the valence band of the spacers 134, and mobile holes 632 confined in the quantum dots in the quantum dot layers 132

Concentration of sunlight produces higher cell performance for two reasons. First, it lowers the blocking barrier, $\varepsilon_B$, 612 which blocks photoelectrons to reach the depletion region 120 of the p-n junction 106 as shown in FIG. 6. Second, it supports generation of additional photocurrent by the two-photon absorption of sub-band gap photons as is shown in detail in FIG. 7.

Figure 8:
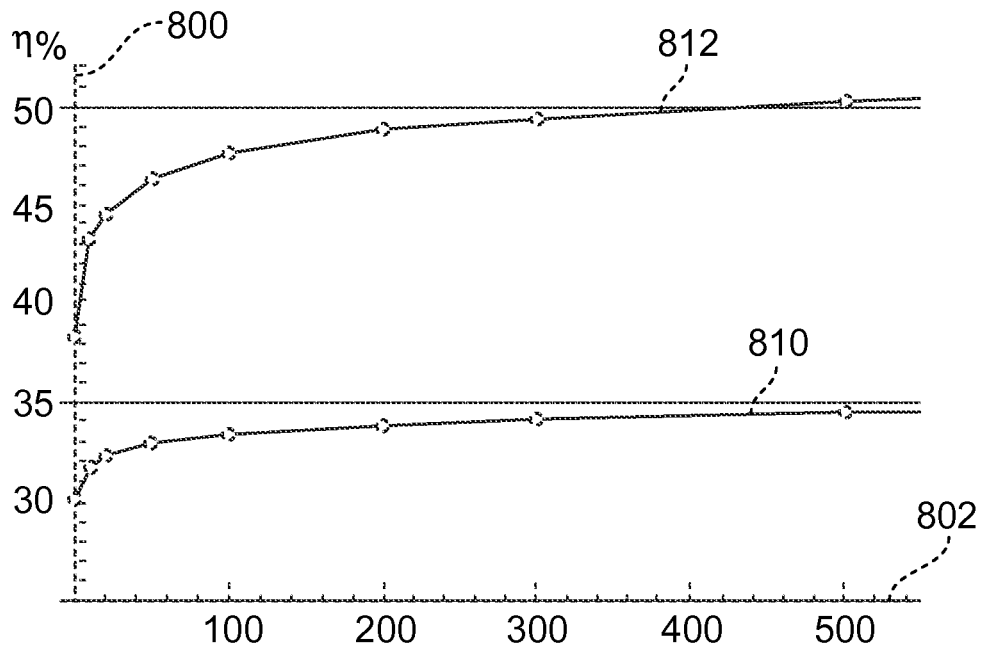
FIG. 8 is a graph showing the improvement in efficiency from the incorporation of the quantum dot stack in the solar cell in FIG. 1.

The blocking barrier represented by line 612 is highly sensitive to the charge accumulated in the quantum dot layers 132 and the AlGaAs buffer layer 122. Since concentration of sunlight modifies the accumulated charge, it also modifies the blocking barrier 612. However, a concentration of about 300-sun reduces the blocking barrier $\varepsilon_B$ 612 of an ideal GaSb/GaAs quantum dot intermediate band solar cell to the thermal energy of mobile carriers. Such a small barrier cannot limit photoelectron diffusion towards p-n junction 106, and therefore photovoltaic performance meets the Luque-Marti limit at 300-sun concentration as shown in FIG. 8. The concentration of sunlight from 1-sun to 500-sun raises efficiency of the solar cell 100 from 30% to 50% as shown in FIG. 8.

Figure 7:
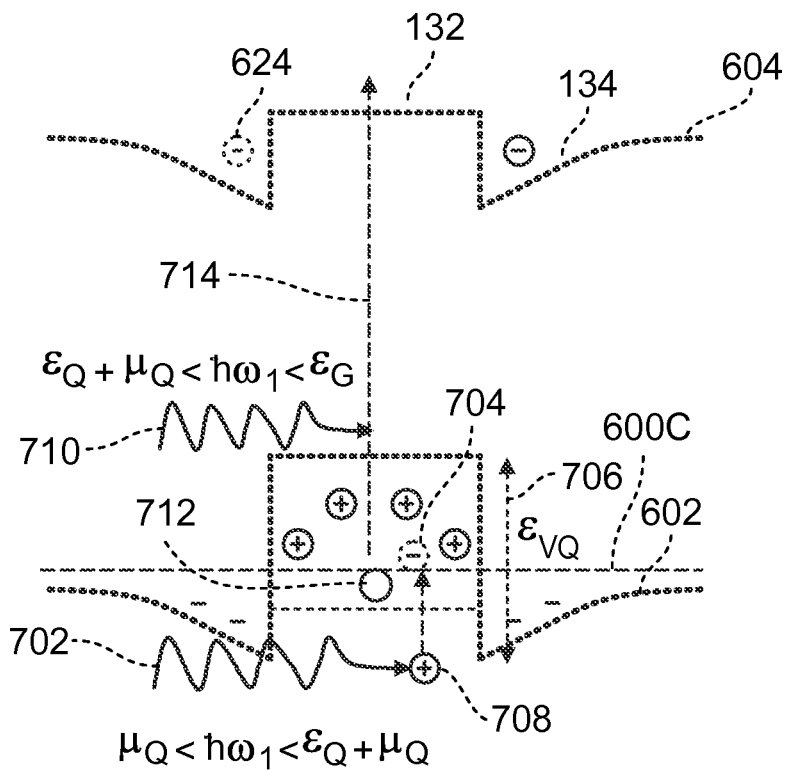
FIG. 7 is a close up of the energy band diagram in FIG. 6 showing a two photon effect that boosts efficiency.

Second, the concentrated sunlight allows for an additional electron transfer from photons. A photon represented by a wavy arrow 620 transfers electrons such as the electron 626 to higher energy states due to photon absorption from photons at relatively high energy levels as shown by a dashed line 622 in FIG. 6. Additional electron transfer may be accomplished by other photons having less energy as shown in FIG. 7. A sub-band gap photon represented by an arrow 702 transfers an electron 704 in the valence band from the top of the $\varepsilon_{VQ}$ offset-barrier represented by a line 706 into the states confined in the quantum dots above the quasi-Fermi level 600C of the confined holes. This leaves a mobile hole 708 at the top of the offset-barrier 706 as shown in FIG. 7 that swiftly diffuses from the quantum dots into the spacer layer 134 and then into the $p^+$-doped $Al_xGa_{1-x}As$ cap layer 104. A positive charge accumulated in the $p^+$-doped $Al_xGa_{1-x}As$ buffer layer 122 balances the diffusion of these generated holes into the buffer layer 122. Another sub-band gap photon represented by a wavy arrow 710 that transfers a confined electron 712 from the valence band 602 into the conduction band 604 as represented by a dashed line 714 and generates a mobile photoelectron on the top of the $\varepsilon_{CQ}$ offset-barrier in the quantum dot layer 132 that swiftly escapes from the quantum dot, relaxes into the conduction band edge of $Al_xGa_{1-x}As$ spacers 134, and diffuse towards p-n junction 106. Accumulation of these photoelectrons 624 in the conduction band of the stack 130 negatively charges the stack 130 while accumulation of holes 634 in the $p^+$-doped $Al_xGa_{1-x}As$ buffer layer 122 positively charges the buffer layer 122. These charges lower the blocking barrier $\varepsilon_B$ 612 and enables generating photoelectrons to pass through the depletion region 120 as shown in FIG. 6.

FIG. 8 displays the conversion efficiency η of the solar cell 100 on a y-axis 800 as a function of sunlight concentration X on an X-axis 802. FIG. 8 includes a lower curve 810, which represents the Shockley-Queisser limit of reference of a GaAs solar cell. The upper curve 812 represents the efficiency of the solar cell 100, which reaches 50% under a 500-sun concentration.

Thus the advantages of the solar cell 100 stem from the quantum dot absorber stack 130 located "outside" the depletion region 120 in the p-doped part of the GaAs p-n junction 106. This prevents additional recombination and leakage currents, which prevent efficient conversion of the solar energy. The Type II quantum dots in the absorber stack 130 allow for the electrons to be spatially separated from the confined holes and high local density of confined electronic states. The focus is on modification of the band alignment at quantum dots by two-photon absorption of concentrated sunlight and its correlation with the solar cell performance. Additional photocurrent generated in a GaSb/GaAs type-II quantum dot solar cell such as the cell 100 due to two-photon absorption of sub-band gap photons shows that a 300-sun concentration of light may push up the conversion efficiency by 15% as compared to the efficiency of a reference single junction GaAs solar cell without quantum dots.

Sub-band gap photons generate mobile photoelectrons that quickly escape from the conduction band of few nm-thick quantum dots into the conduction band of the $Al_xGa_{1-x}As$ spacer layer 134 and relax there in 1 ps. The corresponding holes remain strongly confined in the quantum dots. The escaped photoelectrons diffuse towards the p-n junction 106. In this example, if the absorber stack 130 includes the graded $Al_xGa_{1-x}As$ spacer layers 134, a drift driven by the pulling field of the graded spacers may enforce this diffusion so that photoelectrons become able to pass through the 500 nm absorber stack 130 in 50 ps, which is much shorter than their inter-band recombination lifetime of 1 ns-10 ns.

Each of these embodiments and obvious variations thereof is contemplated as falling within the spirit and scope of the claimed invention, which is set forth in the following claims.

What is claimed is:

1. A solar cell comprising:
   an n-doped substrate layer;
   a p-doped buffer layer disposed on the n-doped substrate layer;
   a quantum dot absorber stack disposed on the p-doped buffer layer, the quantum dot absorber stack including at least one quantum dot layer having quantum dots and at least one spacer layer, wherein the quantum dots spatially separate mobile electrons in the conduction band from holes confined in the valence band in the quantum dots;
   a p-doped cap layer is disposed on the quantum dot absorber stack, the p-doped cap layer for being exposed to a light source; and
   wherein the quantum dot absorber stack is located within an electron diffusion length outside of a depletion region formed by a p-n junction, the p-n junction formed by the n-doped substrate layer and the p-doped buffer layer and the entire quantum dot absorber stack is located outside of the depletion region, and
   wherein the electron diffusion length is based on the materials and the doping levels of the p-doped buffer layer, and
   wherein the p-doped buffer layer has a thickness sufficient to separate the depletion region from the quantum dot absorber stack and to prevent electron tunneling through the p-n junction into electronic states confined in the quantum dots of the at least one quantum dot layer.

2. The solar cell of claim 1, wherein the quantum dot absorber stack is formed by an epitaxial growth of the at least one quantum dot layer and the at least one spacer layer.

3. The solar cell of claim 1, wherein the at least one quantum dot layer is fabricated from GaSb and the at least one spacer layer is fabricated from graded $Al_xGa_{1-x}As$.

4. The solar cell of claim 3, wherein the p-doped cap layer includes a different concentration of aluminum than the at least one spacer layer.

5. The solar cell of claim 1, wherein the quantum dots of the at least one quantum dot layer are a type-II quantum dot.

6. The solar cell of claim 1, further comprising:
   a wide band gap transparent conducting optical window layer formed on the cap layer;
   an electrode in contact with the cap layer; and
   a second electrode in contact with the substrate layer.

7. A method of fabricating a solar cell, comprising:
   n-doping a GaAs substrate to form an n-doped substrate;
   forming a p-doped buffer layer on the n-doped substrate;
   epitaxially forming a plurality of spacer layers and quantum dot layers including quantum dots on the p-doped buffer layer to form a quantum dot absorber stack having a thickness less than an electron diffusion length, wherein the p-doped buffer layer has a thickness sufficient to prevent electron tunneling from a depletion region formed from the n-doped substrate and the p-doped buffer layer into electronic states confined in the quantum dots of the quantum dot layers and to separate the depletion region from the quantum dot absorber stack, wherein the entire quantum dot absorber stack is located outside of the depletion region; and
   forming a p-doped cap layer over the quantum dot absorber stack.

8. The method of claim 7, wherein the p-doped buffer layer prevents electron tunneling from the n-doped substrate in the depletion region into the electronic states confined in the quantum dots of the quantum dot layers.

9. The method of claim 7, wherein the quantum dot layers are fabricated from GaSb and at least one of the plurality of spacer layers is fabricated from graded $Al_xGa_{1-x}As$.

10. The method of claim 9, wherein the p-doped cap layer includes a different concentration of aluminum than the at least one of the plurality of spacer layers and the p-doped buffer layer.

11. A quantum dot based GaAs solar cell comprising:
    an n-doped substrate layer forming one end of a p-n junction;
    a p-doped buffer layer disposed on the n-doped substrate layer and forming another end of the p-n junction, wherein a depletion region is formed from the n-doped substrate layer and the p-doped buffer layer;
    a quantum dot absorber stack disposed on the p-doped buffer layer, the quantum dot absorber stack including a plurality of quantum dot layers having Type II quantum dots and a corresponding plurality of spacer layers, wherein the quantum dots spatially separate mobile electrons in the conduction band from holes confined in the valence band in the quantum dots;

a p-doped cap layer having a p-region formed on the quantum dot absorber stack, the p-doped cap layer for being exposed to a light source; and wherein the quantum dot absorber stack is located within an electron diffusion length outside of the depletion region and the entire quantum dot absorber stack is located outside of the depletion region, wherein the electron diffusion length is based on the materials and doping levels of the p-doped buffer layer, and wherein the p-doped buffer layer has a thickness sufficient to separate the depletion region from the quantum dot absorber stack and to prevent electron tunneling through the p-n junction into electronic states confined in the quantum dots of the plurality of quantum dot layers.

12. The solar cell of claim 11, wherein the quantum dot absorber stack is formed by epitaxial growth of the plurality of quantum dot layers and the plurality of spacer layers.

13. The solar cell of claim 11, wherein the plurality of quantum dot layers is fabricated from GaSb and the plurality of spacer layers are fabricated from graded $Al_xGa_{1-x}As$.

14. The solar cell of claim 11, further comprising:
a wide band gap transparent conducting optical window layer formed on the p-doped cap layer;
an electrode in contact with the p-doped cap layer; and
a second electrode in contact with the n-doped substrate layer.

15. The solar cell of claim 1, wherein the conversion efficiency of the solar cell is 15% greater than the conversion efficiency of a GaAs solar cell without quantum dots.

16. The solar cell of claim 11, wherein the conversion efficiency of the solar cell is 15% greater than the conversion efficiency of a GaAs solar cell without quantum dots.

* * * * *